United States Patent
Chang et al.

(10) Patent No.: US 12,431,215 B2
(45) Date of Patent: Sep. 30, 2025

(54) DYNAMIC READ CALIBRATION

(71) Applicant: Micron Technology, Inc., Boise, ID (US)

(72) Inventors: Li-Te Chang, San Jose, CA (US);
Aaron Lee, Sunnyvale, CA (US);
Zhenming Zhou, San Jose, CA (US);
Murong Lang, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 18/519,248

(22) Filed: Nov. 27, 2023

(65) Prior Publication Data

US 2024/0177795 A1    May 30, 2024

Related U.S. Application Data

(60) Provisional application No. 63/428,548, filed on Nov. 29, 2022.

(51) Int. Cl.
| | |
|---|---|
| *G11C 16/04* | (2006.01) |
| *G11C 16/08* | (2006.01) |
| *G11C 16/28* | (2006.01) |
| *G11C 16/34* | (2006.01) |
| *G11C 29/52* | (2006.01) |

(52) U.S. Cl.
CPC .............. *G11C 29/52* (2013.01); *G11C 16/08* (2013.01); *G11C 16/28* (2013.01); *G11C 16/3404* (2013.01)

(58) Field of Classification Search
CPC ... G11C 16/008; G11C 16/28; G11C 16/3404; G11C 29/52
See application file for complete search history.

(56) References Cited

U.S. PATENT DOCUMENTS

| | | | |
|---|---|---|---|
| 11,934,266 B2 * | 3/2024 | Rayaprolu | G06F 11/076 |
| 2008/0256305 A1 * | 10/2008 | Kwon | G06F 15/167 |
| | | | 711/147 |
| 2011/0307649 A1 * | 12/2011 | Roohparvar | G11C 16/0483 |
| | | | 711/E12.008 |

* cited by examiner

Primary Examiner — Pho M Luu
(74) Attorney, Agent, or Firm — Lowenstein Sandler LLP

(57) ABSTRACT

A system includes a memory device with multiple cells and a processing device to perform operations including: identifying a group of wordlines, each connected to a subset of cells, and assigning a specified charge loss classification value to that group. The operations can also include selecting a page level, selecting a first set of cells, determining, for the first set of cells, a value of a first data state metric, identifying a second set of cells charged to a specified charge state, and determining a value of a second data state metric. The operations can also include maintaining a skew counter of the second data state metric, identifying and updating a read reference voltage offset, as well as applying the updated read reference voltage offset in a read operation.

20 Claims, 9 Drawing Sheets

| CBC Idx | L15 | L14 | ... | L4/L3 |
|---|---|---|---|---|
| 6 | -1 | 0 | ... | 0 |
| 5 | -1 | -1 | ... | 0 |
| 4 | -2 | -3 | ... | -1 |
| 3 | -10 | -11 | ... | -2 |
| 2 | -15 | -12 | ... | -1 |
| 1 | -10 | -16 | ... | -4 |
| 0 | -13 | -21 | ... | -3 |

310 / 311 / 312

| CBC Idx | L15 | L14 | L13 | L12 | L11 | L10/L9 | L8/L7 | L6/L5 | L4/L3 |
|---|---|---|---|---|---|---|---|---|---|
| 7 | 0 | 0 | 0 | 0 | 0 | 0 | 0 | 0 | 0 |
| 6 | -5 | -5 | -5 | -4 | -4 | -3 | -2 | -1 | 0 |
| 5 | -9 | -8 | -7 | -7 | -6 | -5 | -3 | -2 | 0 |
| 4 | -12 | -11 | -10 | -9 | -8 | -7 | -5 | -2 | 0 |
| 3 | -16 | -14 | -13 | -12 | -10 | -8 | -6 | -3 | 0 |
| 2 | -19 | -18 | -15 | -14 | -12 | -10 | -7 | -3 | 0 |
| 1 | -28 | -20 | -18 | -16 | -14 | -12 | -8 | -4 | -1 |
| 0 | -25 | -23 | -20 | -18 | -16 | -13 | -9 | -5 | -1 |

320 / 322

| Valley | LP | UP | XP | TP |
|---|---|---|---|---|
| 1st | L1 | L3 | L2 | L5 |
| 2nd | L4 | L7 | L8 | L10 |
| 3rd | L6 | L9 | L14 | L12 |
| 4th | L11 | L13 | n/a | L15 |

DYNAMIC READ CALIBRATION

REFERENCE TO RELATED APPLICATIONS

This application claims the priority benefit of U.S. Provisional Application No. 63/428,548, filed Nov. 29, 2022, which is incorporated by reference herein.

TECHNICAL FIELD

Embodiments of the disclosure relate generally relate to memory sub-systems, and more specifically, relate to managing read operation parameters on memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 depicts a set of interrelated calibration and logical page tables, in accordance with some embodiments of the present disclosure;

DETAILED DESCRIPTION

Figure 1:
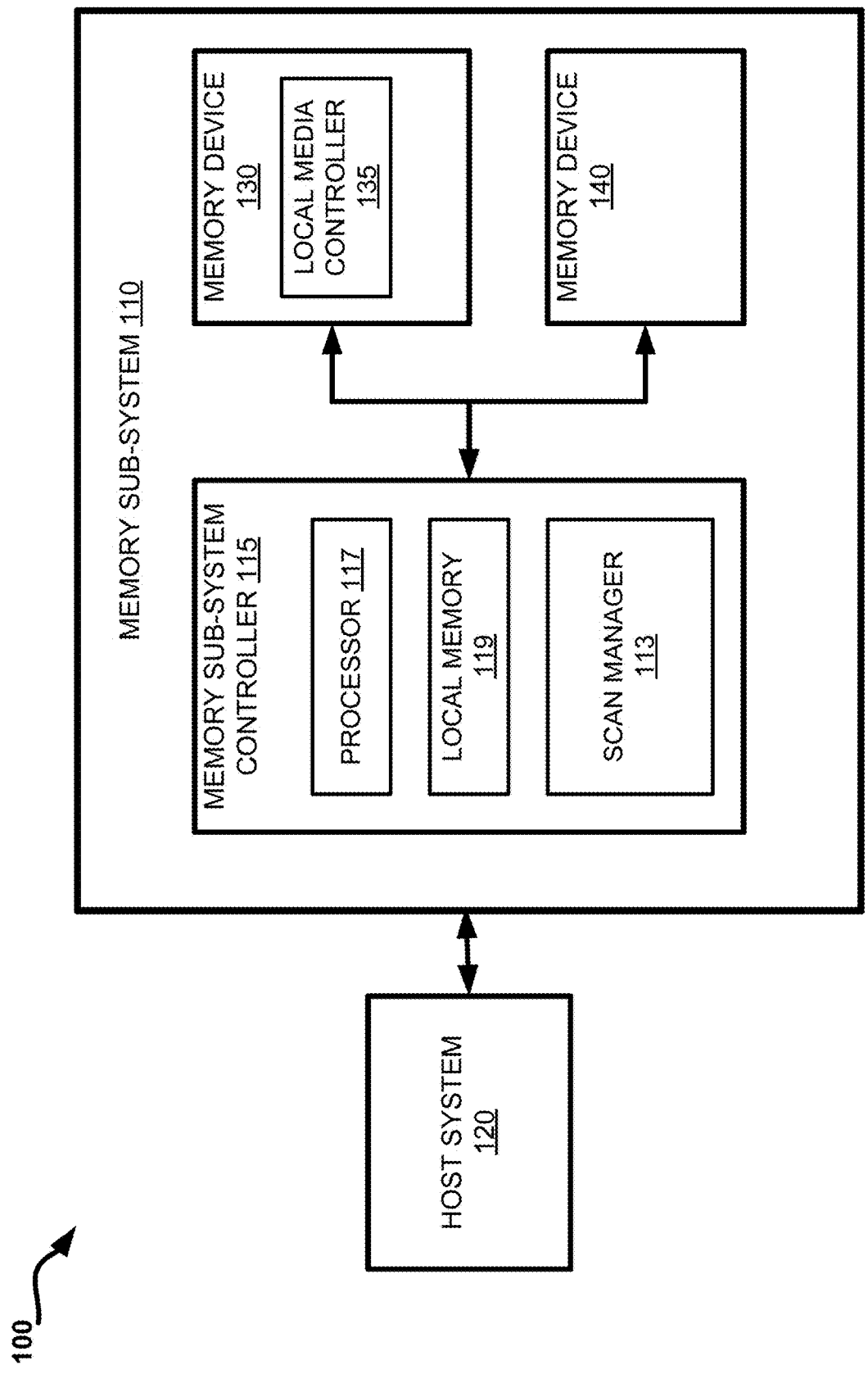
FIG. 1 illustrates an example computing system that includes a memory sub-system in accordance with some embodiments of the present disclosure.

Aspects of the present disclosure are directed to dynamic calibration of read voltage memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane can consist of a set of physical blocks. In some embodiments, each block can include multiple sub-blocks. Each block can consist of a set of pages. Each page can consist of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be etched onto a silicon wafer in an array of columns connected by conductive lines (also hereinafter referred to as bitlines or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG} < V_t$. The current increases substantially once the control gate voltage has exceeded the threshold voltage, $V_{CG} > V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t) = dW/dV_t$, where dW represents the probability that any given cell has its threshold voltage within the interval $[V_t, V_t + dV_t]$ when charge Q is placed on the cell.

A programming operation can be performed by applying a series of incrementally increasing programming pulses to the control gate of a memory cell being programmed. A program verify operation after each programming pulse can determine the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A program verify operation can include applying a ramped voltage to the control gate of the memory cell being verified. When the applied voltage reaches the threshold voltage of the memory cell, the memory cell turns on and sense circuitry detects a current on a bit line coupled to the memory cell. The detected current activates the sense circuitry and determines the present threshold voltage of the cell. The sense circuitry can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Accordingly, certain non-volatile memory devices can use a demarcation voltage (i.e., a read reference voltage) to read data stored at memory cells. For example, a read reference voltage (also referred to herein as a "read voltage") can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ can be fit into the working range allowing for storage and reliable detection of multiple values of the charge $Q_k$, k=1, 2, 3 . . . . The distributions are interspersed with voltage intervals ("valleys") where none (or very few) of the cells of the device have their threshold voltages. Such valley margins can, therefore, be used to separate various charge states $Q_k$—the logical state of the cell can be determined by detecting, during a read operation, between which two valleys the respective threshold voltage $V_t$ of the cell resides. This effectively allows a single memory cell to store multiple bits of information: a memory cell operated with 2N-1 well-defined valleys and 2N distributions is capable of reliably storing N bits of information. Specifically, the read operation can be performed by comparing the measured threshold voltage $V_t$ exhibited by the memory cell to one or more reference voltage levels corresponding to known valley voltage levels (e.g., centers of the valleys) of the memory device in order to distinguish between the multiple logical programming levels and determine the programming state of the cell.

Precisely controlling the amount of the electric charge stored by the cell allows multiple logical states to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective Vi level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

In some memory sub-systems, a read operation can be performed by comparing the measured threshold voltages ($V_t$) exhibited by the memory cell to one or more reference voltage levels in order to distinguish between two logical states for single-level cell (SLCs) and between multiple logical states for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, tri(ple)-level cell (TLC) memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type at a single page level referred to as a lower logical page (LP). Multi-level cell (MLC) physical page types can include pages at multiple page levels such as LPs and upper logical pages (UPs). TLC physical page types include LPs, UPs, and pages at an additional page level referred to as extra logical pages (XPs), and QLC physical page types include LPs, UPs, XPs and pages at a further page level referred to as top logical pages (TPs). The different page types (LP, UP, XP, TP, etc.) can be referred to as levels within a page level hierarchy that can exist within the same physical memory page. For example, a physical memory page formed from memory cells of the QLC memory type can have a total of four logical pages, where each logical page can store data distinct from the data stored in the other logical pages associated with that physical memory page, which is herein referred to as a "page."

Memory devices can experience random workloads over the course of their operation that impact the $V_t$ distributions of their memory cells. For example, the $V_t$ distributions can be shifted to higher or lower values. A temporal shift of $V_t$ (i.e., a shift of the $V_t$ distributions over a period of time), for example, can be caused by a quick charge loss (QCL) that occurs soon after programming and by a slow charge loss (SCL) that occurs as time passes during data retention. To compensate for various $V_t$ distribution shifts, calibration operations can be performed in order to adjust the read level voltages, which can be done on a distribution-by-distribution basis, as higher $V_t$ levels tend to incur more temporal shifting than do lower $V_t$ levels. In certain memory devices, read voltage level adjustments can be performed based on values of one or more data state metrics obtained from a sequence of read and/or write operations. In an illustrative example, the data state metric can be represented by a raw bit error rate (RBER), which refers to the error rate in terms of a measure of bits that contain incorrect data (i.e., bits that were sensed erroneously) when a data access operation is performed on a memory device (e.g., a ratio of the number of erroneous bits to the number of all data bits stored in a certain portion, such as a specified block, of the memory device). In these memory devices, sweep reads can be performed to create RBER/log likelihood ratio (LLR) profiles for error correction code (ECC) and select the most efficient profile. Such calibrations can be performed to accurately predict where valleys are located between $V_t$ distributions for purposes of accurately reading data from the memory cells.

Because of the incorrect $V_t$ sensed for some cells when performing read operations, the rate at which error handling operations (e.g., remedial ECC operations) are triggered (referred to herein as a "trigger rate") by the memory device during the read operations can be high, even for memory devices in which calibration techniques are employed to address the temporal $V_t$ shifts. As used herein, read trigger rate refers to a measure (e.g., a count, or frequency) of read operations that trigger additional read error handling operations (e.g., remedial ECC operations), caused by a high raw bit error rate (RBER) encountered during the read operation. A high read trigger rate can be observed in QLC NAND devices despite the implementation of static calibration. Thus, the read trigger rate can correspond to the probability that an initial attempt to retrieve data fails (e.g., when a code word fails hard decode) and therefore directly correlates with system performance and quality of service (QoS). For example, if a set of data (e.g., codeword) fails a hard bit read operation, an error recovery flow will be triggered and increase the latency of the data being retrieved. This delay negatively impacts QoS and uses additional computing resources. This effect and its negative impacts on memory devices are evident in storage applications for mobile, embedded storage, storage (consumer, client, datacenter devices) or external customers.

Furthermore, memory cells in a memory device can wear out over time as their ability to retain a charge (i.e., data) and, consequently, to remain at a particular programming level deteriorates with the passage of time as well as with increased use. Thus, in some cases, the quality of data retention can be reflected by a measurable degree of data degradation indicated by an error rate experienced during a read operation performed on the data. This degree of degradation can be reflected by and can correspond to various respective values of data state metrics (e.g., valley shift values, read counts, valley width values, error counts, RBER, RWB, etc.). These values (e.g., of valley shift or read count) and their corresponding indication of data retention quality or capability on a memory device, can be known from statistics and historical data obtained from scans and testing of various memory devices. Furthermore, effect of these temporal shifts on the trigger rate can be expected to worsen with the additional passage of time and increased use of the device.

To counteract the effects of SCL and other temporal shifting of various $V_t$ distributions of the memory cells on memory devices, the susceptibility of the memory cells to such effects can be indexed by a charge loss bucket classifier (CBC) index that can subsequently be used for calibrating read voltage levels applied during read operations performed on those cells. For example, particular wordlines (i.e., along with the memory cells directly connected to those wordlines) can be assigned CBC index values that respectively correspond to measures of susceptibility to SCL. For each respective programming level of a memory cell, or for groups of programming levels (e.g., programming levels constituting a particular logical page), these measures of susceptibility can be directly correlated with theoretically known and experimentally verified corresponding $V_t$ distribution shift amounts. Accordingly, to compensate for the SCL and to calibrate read operations, a calibration table (e.g., a look-up-table) indicating read voltage level offsets that should be applied to a memory cell programmed to a particular programming level depending on the CBC index assigned to the cell or the wordline to which it is connected.

However, such calibration tables can end up being detrimental and inadequate for calibrating the voltages applied during read operations. Because the $V_t$ distributions of some programming levels of memory cells are more susceptible to the effects of SCL and because memory cells in different locations can be affected by SCL by different amounts, the $V_t$ distributions can often shift in a manner that is not linear with respect to time. Accordingly, compensating for such shifts by calibrating read operations (e.g., by coarse calibration) using look-up-tables with static corresponding read voltage offset values can not only be inadequate for reducing the trigger rate, but can, in some cases, even exacerbate the trigger rate. In some memory sub-systems, additional calibration operations (e.g., fine calibration) can also be initiated when coarse calibration (i.e., calibration using static offset values in a look-up-table) fails to remedy the errors generated during an earlier attempt to perform a read operation. These additional calibration operations can entail the application of multiple additional read voltages (i.e., read strobes) at smaller deviations (i.e., offsets) from an initial predetermined read voltage level (e.g., either a theoretically known default voltage level used to detect a particular programming state of a cell or a previously offset read voltage). Accordingly, these approaches are undesirable since the high trigger rate and the associated additional read strobes negatively affect both host performance and Quality of Service (QoS) (i.e., due to increased latency).

Aspects of the present disclosure address the above and other deficiencies by using data state metrics that are obtained during various scans that are performed on the memory device to dynamically adjust read voltage offsets. More specifically, various embodiments presently disclosed use scans performed on particular wordlines and pages of memory devices to adjust read voltage level offsets based on the aggregate values of one or more data state metrics obtained from the scans that can be compared to one or more threshold values. These voltage level offsets can then be used to adjust the read voltage levels applied during subsequent read operations being performed on those cells, wordlines, and/or pages.

Advantages of the present disclosure include reducing the read trigger rates associated with SCL and static read voltage level calibration on memory devices, thus reducing the latency of memory access operations performed by the memory device. More specifically, since additional operations (e.g., ECC operations caused by a high trigger rate or fine calibration operations caused by the failure of coarse calibration based on static calibration tables to reduce the errors/trigger rate) increase the time elapsed for data to be retrieved and provided to the requesting host system and since they consume additional computing resources, reducing the read trigger rate can decrease the latency and increase the availability of resources for performing other operations. This reduction in read trigger rates improves the quality of service (QoS) that users will experience in accessing data during read operations. Thus, as explained in more detail below, the embodiments described in this disclosure improve the performance of memory devices through partial block read compensation. Other advantages will be apparent based on the additional details provided herein. FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a scan manager 113 that can perform scans on memory device 130 to obtain values of data state metrics on the memory device 130. In several embodiments, the scan manager 113 can receive and respond to data access requests from host system 120 and manage calibration of applied voltages (i.e., manage compensation for $V_t$ shifts) by controlling the voltages that are applied during read operations on memory device 130. In some embodiments, the memory sub-system controller 115 includes at least a portion of the scan manager 113. In some embodiments, the scan manager 113 is part of the host system 110, an application, or an operating system. In other embodiments, local media controller 135 includes at least a portion of scan manager 113 and is configured to perform the functionality described herein.

Memory scan manager 113 can perform various actions such as handling the interactions of memory sub-system controller 115 with the memory device 130 of memory sub-system 110. For example, in some embodiments, the scan manager 113 can transmit, to memory device 130 memory access commands that correspond to requests received by memory sub-system 110 from host system 120, such as program commands, read commands, and/or other commands. Besides, the scan manager 113 can receive data from memory device 130 such as data retrieved in response to a read command or a confirmation that a write/program command was completed successfully.

In some embodiments, the memory sub-system controller 115 can include a processor 117 (processing device) configured to execute instructions stored in local memory 119 for performing the operations described herein. In other embodiments, the operations described herein are performed by the scan manager 113. In yet other embodiments, local media controller 135 can perform the operations described herein. In at least one embodiment, memory device 130 can include a memory access manager configured to carry out memory access operations (e.g., operations performed in response to memory access commands received from processor 117 or from the scan manager 113). In some embodiments, local media controller 135 can include at least a portion of scan manager 113 and can be configured to perform the functionality described herein. In some of these embodiments, the scan manager 113 can be implemented on memory device 130 using firmware, hardware components, or a combination of firmware and hardware components. In an illustrative example, the scan manager 113 can receive, from a requesting component, such as processor 117, a request to read a data page of the memory device 130, and respond to it by performing the requested read operation. For the purposes of this disclosure, a read operation can include a series of read strobes (also referred to as pulses), such that each strobe applies a specific read voltage level to a particular wordline of a memory device 130. In the read operation, each strobe can be used to compare the estimated threshold voltages $V_t$ of a set of memory cells to one or more read voltage levels corresponding to the expected positions of the voltage distributions of the memory cells.

The scan manager 113 can, in some embodiments, perform various scans on data storage elements (e.g., pages) of the memory device 130. For the purposes of this disclosure, data storage elements, such as cells (e.g., connected within an array of WLs and BLs), pages, blocks, planes, dies, as well as groups and combinations of one or more of the foregoing elements, can be referred to as "data storage units". In the context of two data storage units, the data storage unit that can include or subsume the other data storage unit can be referred to as the "higher order data storage unit". Similarly, in the same context, a storage unit that can be included in or subsumed by the other data storage unit can be referred to as the "lower order data storage unit". The present disclosure emphasizes some embodiments where the higher order data storage units (i.e., $Unit_{Type1}$) are represented by dies that include respective groups of lower order data storage units (i.e., $Unit_{Type2}$) that are represented by pages (i.e., embodiments where relationships between higher order data storage units and lower order data storage units are represented by the relationships between dies and pages). In other embodiments, analogous relationships are contemplated with respect other $Unit_1$:$Unit_2$ pairs in the hierarchy (i.e., relationships between $Unit_{Type1}$:$Unit_{Type2}$ pairs such as die:plane, die:block, die:cell array, die:cell, plane:block, plane:page, plane:cell array, plane:cell, block:page, block:cell array, block:cell, page:half-page, page:cell array, page:cell, block:wordline, plane:block-and-page-combination, die:page-and-cell-array-combination, etc).

As noted, these scans can produce measurements of a variety of different data state metrics including error count, RBER, valley shift, valley width, read count, etc. For the purposes of the present disclosure, a read count can refer to the number of times the data stored in a particular location of a memory device has been accessed (i.e., read).

Thus, in some embodiments, the scan manager 113 can scan a group of wordlines or particular logical pages of the group of wordlines residing on the memory device 130. In some embodiments, the scans performed by the scan manager 113 can include scans that facilitate read voltage calibration as well as scans that check the data integrity after various read-disturb stresses. For example, the scan manager 113 can perform, on each page in the group, a scan that can be referred to as a valley health check that generates the following data state metric measurements: the valley width between two specified adjacent $V_t$ distributions; and the center of the valley (and the shift of the center from a previous measurement). In another example, the scan manager 113 can perform, on each page in the group, a scan referred to as a read disturb scan on the group of pages to obtain the following data state metric measurements: a read count for the page, and the center of the valley between two specified adjacent $V_t$ distributions (and the shift of the center from a previous measurement). As will be described in more detail with reference to FIGS. 2B-2D, the values of the metrics directly obtained by the scans performed by the scan manager 113 can reflect (i.e., through an application of a known mathematical transformation) the measure of another data state metric. For example, by performing a valley health check scan, the scan manager 113 can obtain an error count at one valley margin ($EC_1$) and an error count at another valley margin ($EC_2$) to derive the valley width which can be represented by $$\log_{10}\left(\frac{((EC_1) + (EC_2))}{2}\right).$$

Similarly, by performing a valley health scan, the scan manager 113 can obtain a current measure of a valley center to derive the valley shift by subtracting a previous measure of the valley center from the current measure of the valley center. Analogously, by performing a read disturb scan, the scan manager 113 can obtain a current measure of a read count to derive a value of a logarithm of the read count (i.e. $\log_{10}$(Read Count) that can be matched with a corresponding valley width value.

Accordingly, in some embodiments, the scan manager 113 can identify, among a the wordlines on the memory device 130, a group of wordlines, where each wordline of the group of wordlines is connected to a respective subset of memory cells. In some embodiments, the scan manager 113 can identify the wordlines in a group based on a parameter that determines a location or property of the cells on the wordline. For example, the scan manager 113 can select a set of wordlines to scan (a "scan group") where each wordline is selected based on a parameter that determines a location or property of the cells on the wordline (e.g., the index of the wordline within a particular page, the SCL susceptibility of the wordline, the indicator of which diel/plane/block the wordline is on, etc.). In one embodiment, the wordlines can be selected such that a representative sampling of wordlines sharing a particular parameter form part of the scan group. In several embodiments the identified group of wordlines that form part of the scan group can include wordlines connected to memory cells programmed to logical states within one or more logical pages.

Thus, in some embodiments, the scan manager 113 can assign, to the group of wordlines, a specified charge loss classification value corresponding to a shift of a threshold voltage distribution. For example, the scan manager 113 can use statistical or experimental data to determine the respective measures of SCL susceptibility of one or more wordlines and, on that basis, assign a charge loss classification value that characterizes the shift of a threshold voltage distribution on those wordlines. In some embodiments, the scan manager 113 can identify the wordlines having the same or similar SCL susceptibility measures and assign a corresponding CBC index value to each of the wordlines in the group or to the entire group, by recording the assigned CBC index value as metadata associated with respective identifiers of the wordlines in the group. The CBC index and correspondence to the susceptibility of the memory cells to SCL are described in more detail with reference to FIG. 3, which illustrates a set of interrelated calibration table 310, 320 and logical page tables 330, in accordance with some embodiments of the present disclosure. In the illustration, In the illustration of FIG. 3, calibration table 320 is a modified version of the abbreviated calibration table 310. The calibration table 320, can include a CBC index column 311 containing entries, each entry indicating a CBC index value that can be assigned to one or more wordlines (e.g., based on an experimentally and/or statistically known measure of the susceptibility of the memory cells on those wordlines to SCL). Further the calibration table 320 can include programming level columns 312 for each programming level to which a memory cell (e.g., in a group of wordlines, on the memory device 130) can be programmed. Using the programming level to which a memory cell is programmed, and the CBC index assigned to the wordline to which the memory cell is connected, the scan manager 113 can determine a corresponding offset which can be applied to a read reference voltage. Accordingly, the calibration table can include entries within each of which an offset value is recorded for a respective pair of parameters, a programming level and a CBC index value.

Further, the scan manager 113 can select a page level within a page level hierarchy, where the selected page level includes a particular set of memory cell charge states. The scan manager 113 can then select a set of memory cells that has one or more memory cells having their respective charge states correspond to the page level (i.e., the cells whose charge state is within the page level). The page level hierarchy and the correspondence of particular logical memory pages within a physical memory page to respective sets of memory cell charge states can be further understood with reference to FIG. 2A which depicts schematically illustrates a distribution 200A of threshold control gate voltages for a memory cell capable of storing three bits of data by programming the memory cell into at least eight charge states that differ by the amount of charge on the cell's floating gate.

Figure 2A:
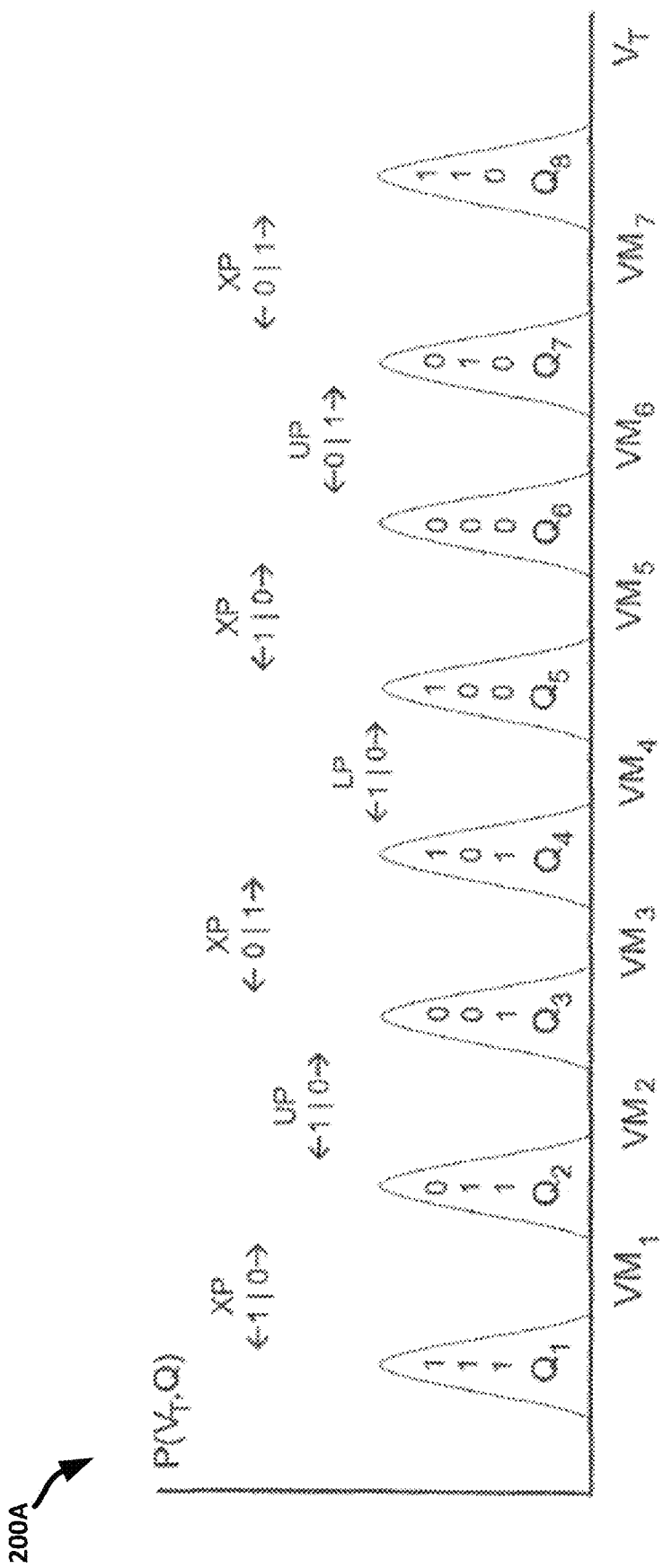
FIG. 2A illustrates schematically a distribution of threshold control gate voltages for a flash memory cell capable of storing three bits of data by programming the memory cell into at least eight charge states that differ by the amount of charge on the cell's floating gate, in accordance with some embodiments of the present disclosure

FIG. 2A shows distributions 200A of threshold voltages $P(V_T, Q_k)$ for $2^N=8$ different charge states of a tri-level cell (TLC) separated with $2^3-1=7$ valley margins $VM_k$. Accordingly, a memory cell programmed into a k-th charge state (i.e., having the charge $Q_k$ deposited on its floating gate) can be storing a particular combination of N bits (e.g., 0110, for N=4). This charge state $Q_k$ can be determined during a readout operation by detecting that a control gate voltage $V_{CG}$ within the valley margin $VM_k$ is sufficient to open the cell to the source-drain current whereas a control gate voltage within the preceding valley margin $VM_{k-1}$ is not.

In general, storage devices with NAND memory can be classified by the number of bits stored by each cell of the memory. For example, as noted above, a single-level cell (SLC) memory has cells that can each store one bit of data (N=1). A multi-level cell (MLC) memory has cells that can each store up to two bits of data (N=2), a tri(ple)-level cell (TLC) memory has cells that can each store up to three bits of data (N=3), and a quad-level cell (QLC) memory has cells that can each store up to four bits of data (N=4). In some storage devices, each wordline of the memory can have the same type of cells within a given partition of the memory device. Accordingly, in some devices, all wordlines of a block or a plane can be SLC memory, or all wordlines can be MLC memory, or all wordlines can be TLC memory, or all wordlines can be QLC memory. Because in some devices, an entire wordline is biased with the same control gate voltage $V_{CG}$ during write or read operations, a wordline in SLC memory typically hosts one memory page (e.g., a 16 KB or a 32 KB page) that is programmed in one setting (by selecting various bitlines consecutively). A wordline of a higher-level (MLC, TLC, or QLC) memory cell can host multiple pages on the same wordline. Different pages can be programmed (by the scan manager 113 of memory controller 115 via electronic circuitry) in multiple settings. For example, in some embodiments, after a first bit is programmed on each memory cell of a wordline, adjacent wordlines can first be programmed before a second bit is programmed on the original wordline. This can reduce electrostatic interference between neighboring cells. The memory controller 115, via scan manager 113, can program a state of the memory cell and then read can read this state by comparing a read threshold voltage $V_T$ of the memory cell against one or more read level thresholds. The operations described herein can be applied to any N-bit memory cells.

For example, a TLC can be capable of being in one of at least eight charging states $Q_k$ (where the first state can be an uncharged state $Q_1=0$) whose threshold voltage distributions are separated by valley margins $VM_k$ that can be used to read out the data stored in the memory cells. For example, if it is determined during a read operation that a read threshold voltage falls within a particular valley margin of $2^N-1$ valley margins, it can then be determined that the memory cell is in a particular charge state out of $2^N$ possible charge states. By identifying the right valley margin of the cell, it can be determined what values all of its N bits have. The identifiers of valley margins (such as their coordinates, e.g., location of centers and widths) can be stored in a read level threshold register of the memory controller 115.

The read operation can be performed after a memory cell is placed in one of its charged states $Q_k$ by a previous write operation. For example, to program (write) 96 KB (48 KB) of data onto cells belonging to a given wordline M of a TLC, a first programming pass can be performed. The first programming pass can store 32 KB (16 KB) of data on the wordline M by placing appropriate charges on the floating gates of memory cells of the wordline M. For example, a charge Q can be placed on the floating gate of a specific cell. A cell is programmed to store value in its lower-page (LP) bit if the cell is charged to any of the charge states $Q_1$, $Q_2$, $Q_3$, or $Q_4$. The cell is programmed to store value 0 in its LP bit if the cell is charged to any of the charge states $Q_5$, $Q_6$, $Q_7$, or $Q_8$. As a result, during a read operation it can be determined that the applied control gate voltage $V_{CG}$ placed within the fourth valley margin $VM_4$ is sufficient to open the cell to the source-drain electric current. Hence, it can be concluded that the cell's LP bit is in logical state 1 (i.e., being in one of the charge states $Q_k$ with k≤4). Conversely, during the read operation it can be determined that the applied control gate voltage $V_{CG}$ within the fourth valley margin is insufficient to open the cell to the source-drain electric current. Hence, it can be concluded that the cell's LP bit is in logical state 0 (i.e., being in one of the charge states $Q_k$ with k>4).

In some embodiments, after cells belonging to the M-th wordline have been programmed as described, the LP has been stored on the M-th wordline and the programming operation can proceed with additional programming passes to store an upper page (UP) and an extra page (XP) on the same wordline. Although such passes can be performed immediately after the first pass is complete (or even all pages can be programmed in one setting), in order to minimize errors it can be advantageous to first program LPs of adjacent wordlines (e.g., wordlines M+1, M+2, etc.) prior to programming UP and XP into wordline M.

When the UP is to be programmed into wordline M, a charge state of a memory cell can be adjusted so that its distribution of threshold voltages is further confined to be within a known set of valley margins VM. For example, a cell that is in one of the charge states $Q_1$, $Q_2$, $Q_3$, or $Q_4$ (i.e., a cell accorded a logical bit state of 1 for LP programming) can be charged to just one of two states $Q_1$ or $Q_2$, in which case the cell is to store value 1 in its UP bit. Conversely, a cell can be charged to one of two states $Q_3$ or $Q_4$ to store value 0 in its UP bit. As a result, during a read operation it can be determined that the applied control gate voltage $V_{CG}$ within the second valley margin $VM_2$ is sufficient to open the cell to the source-drain electric current. Hence, it can be concluded that the cell's UP bit is in a logical bit state of 1 (i.e., being in one of the charge states $Q_k$ with k≤2). Conversely, during a read operation it can be determined that the applied control gate voltage $V_{CG}$ within the second valley margin $VM_2$ is insufficient to open the cell to the source-drain electric current. Hence, it can be concluded that the cell's UP bit is in a logical state of 0 (i.e., being in one of the charge states $Q_k$ with 2<k≤4). Likewise, charge states $Q_5$, $Q_6$, $Q_7$, or $Q_8$ (accorded bit 0 status for LP programming) can be further driven to the states $Q_5$ or $Q_6$ (UP bit value 0) or the states $Q_7$ or $Q_8$ (UP bit value 1).

Similarly, the extra page (XP) can be programmed into the wordline M by further adjusting the charge state of each its memory cell. For example, a cell that is in the logical state of 10 (i.e., UP bit stores value 1 and LP bit stores value 0) and is in one of the charge states $Q_7$ or $Q_8$ can be charged to state $Q_7$ to store a value of 0 in its XP bit (i.e., logical state 010). Alternatively, the cell can be charged to charge state $Q_8$ to store a value of 1 in its XP bit (i.e., a logical state 110). As a result, during a read operation it can be determined that the applied control gate voltage $V_{CG}$ within the seventh valley margin is insufficient to open the cell to the source-drain electric current. Hence, the memory controller 115 can determine that the cell's logical state is 110 (corresponding to charge state $Q_7$). Conversely, during a read operation it can be determined that the applied control gate voltage $V_{CG}$ within the seventh valley margin $VM_7$ is sufficient to open the cell to the source-drain electric current. Hence, the memory controller 115 can determine that the cell's XP bit stores a value of 0. If it is further determined that control gate voltages $V_{CG}$ within the first six valley margins are insufficient to open the cell to the electric current, the memory controller 115 can ascertain the logical state of the cell as 010 (i.e., corresponding to the charge state $Q_7$).

Accordingly, the scan manager 113 can select a page (i.e., a logical page) among multiple levels of the page level hierarchy where each level contains different sets of memory cell charge states to which the cells on the wordlines of the identified wordline group might be charged. Each page level can correspond to a logical page type that include a particular set of charge states (i.e., programming levels or logical states to which the memory cells can be programmed). For example, the QLC memory cells connected to the wordlines of the wordlines group can be programmed to a state that is part of one of four logical pages, such as a lower page (LP), upper page (UP), extra page (XP), and top page (TP). The memory cells can be programmed to an erased state or can be programmed to one of fifteen other programming levels each of which can belong to one of the pages 315, LP, UP, XP, or TP, as depicted in table 330 of FIG. 3.

Having selected the group of wordlines and the logical page which is to be scanned, the scan manager 113 can scan the group of wordlines. For example, the scan manager 113 can scan the wordlines in the group of wordlines that belong to the selected logical page (i.e., that are connected to memory cells that are programmed to a programming level within the selected logical page). Each scan can include performing a coarse read calibration and can also include performing a fine read calibration each of which involves the application of one or more read reference voltages that can be offset relative to an initially applied read reference voltage and can include determining one or more data state metric values such as an RBER or an EC for the memory cells and wordlines being scanned. To perform a coarse read calibration, the scan manager can apply a read reference voltage determined based on offsets recorded in a calibration table (e.g., a coarse calibration table containing an entry indicating an offset value relative to a default read-reference voltage for reading a memory cell programmed to a particular programming level. To scan a memory cell on one of the wordlines in the group, the scan manager 113 can apply read reference voltage determined by referencing the calibration table 320 (e.g., a default pre-determined read reference voltage recorded in a setting of the memory device 130 used to read a memory cell programmed to a particular logical state adjusted by a corresponding offset determined based on the CBC index value of the wordline to which the memory cell is connected). Thus, in some embodiments, the scan manager 113 can scan the group of wordlines by applying one or more sequences of read reference voltage pulses to the memory cells connected to the group of wordlines.

Accordingly, in some embodiments, the scan manager 113 can select a set of memory cells the respective charge states of which correspond to the page level (i.e., a set of memory cells all charged to a charge state within the set of charge states of the selected page level). The scan manager 113 can then determine, for the set of memory cells whose charge state is within the page level (i.e., whose programmed logical state is within the logical page) that was selected, an aggregate respective values of a one or more data state metrics. In the various embodiments, the scan manager 113 can determine an aggregate value for each of the data state metrics that it measures during the scan. In some embodiments, the data state metric that is determined can be a raw bit error rate (RBER), and can also be an error count (EC). Accordingly, in some embodiments, the scan manager can determine an aggregate raw bit error rate (RBER) value. In the same or other embodiments, the scan manager can determine an aggregate error count (EC).

In some embodiments, the scan manager 113 can determine whether a determined individual or aggregate value of a measured data state metrics satisfies a criterion. For example, in some cases the criterion can be satisfied if the value is equal to or exceeds a pre-determined threshold value (e.g., when an RBER is greater than N bit-errors/ms). In other cases, the criterion can be satisfied if the value is equal to or is less than a pre-determined threshold value (e.g., when an EC is less than M errors). Thus, in some embodiments, the scan manager 113 can determine whether the aggregate value of the data state metric satisfies the criterion (e.g., the RBER criterion). The scan manager 113 can determine whether the aggregate RBER value exceeds the threshold value of N. Responsive to determining that the aggregate value of the data state metric satisfies a first criterion (e.g., responsive to determining that the aggregate RBER value satisfies the first criterion because the measured aggregate RBER value is equal to or greater than the pre-determined threshold value of N), the scan manager 113 can identify, among the set of memory cells, another set of memory cells charged to a specified charge state within the page level (i.e., memory cells that are programmed to a specified logical state within the logical page) that was selected. For example, when scanning a group of wordlines within the TP, in response to determining that the aggregate RBER value exceeds the threshold value, the scan manager 113 can identify the memory cells programmed to programming level L5.

In the same or other embodiments, having identified the memory cells programmed to a logical state within the page (e.g., L5 in the TP), the scan manager 113 can, determine, for this other set of memory cells, an aggregate value of another data state metric based on one or more distributions of individual values of this data state metric. For example, the scan manager 113 can apply another one or more sequences of read reference voltage pulses to the memory cells connected to the group of wordlines or to a set of wordlines within the group. In the various embodiments, each of the sequences of voltage pulses can include one or more groups of read reference voltage pulses, where each group of read reference voltage pulses generates a corresponding distribution of individual values of a data state metric (e.g., RBER, EC). Each of the data state metric values can respectively have a corresponding read reference voltage from which it is generated. Thus, the scan manager 113 can apply another sequence of read reference voltage pulses to the memory cells connected to the group of wordlines, and generate a corresponding distribution of individual ECs, each individual EC corresponding to a respective read reference voltage.

For example, if the scan manger 113 previously determined the RBER of an initial set of memory cells, the scan manager at this point can determine an aggregate EC for this other set of memory cells based on one or more distributions of EC obtained from the application of multiple voltage pulses during the coarse calibration and fine calibration. Accordingly, the scan manager 113 can determine, for this smaller set of memory cells, an aggregate EC based on one or more distributions of individual ECs. The scan manager 113 can further determine whether the aggregate value of this other data state metric for the newly selected set of memory cells satisfies a different criterion (e.g., an EC criterion). For example, this different criterion can be satisfied when an aggregate data state metric value (e.g., an EC) is equal to or greater than a threshold value. In the same example, this different criterion can fail to be satisfied when an aggregate data state metric value (e.g., an EC) is less than the threshold value. Thus, in some embodiments, the scan manager 113 can determine whether an aggregate (e.g., maximum, minimum, average, center, etc.) EC is equal to or greater than a threshold value M.

As the scan manager 113, performs the scans, it can measure the ECs resulting from each particular applied voltage pulse. Accordingly for each voltage pulse, the scan manager 113 can measure and record a corresponding EC which, together with other measured ECs can form a distribution of EC. In this process, the scan manager 113 can maintain a skew counter that counts skewed distributions of the second data state metric and records them in entries of the calibration table 320 or another table. Skewed distributions are distributions of values (e.g., values of a data state metric) that are asymmetrical in that one tail (i.e., side) of the distributions is longer (i.e., extends further from the center) than the other. In the several embodiments, a skewed distribution can be identified as a distribution of values having one of its tails be longer than the other tail by more than a predetermined threshold amount. Accordingly, the scan manager 113 can identify skewed distributions of the second data state metric by determining whether one side of a given distribution extends further from the center than the other side by more than the predetermined threshold amount. In some embodiments, in response to determining that the aggregate value of a data state metric (e.g., EC) satisfies the criterion, the scan manager 113 can increment a value in a table entry for each positively skewed distribution and decrementing the value for each negatively skewed distribution of the individual values of the data state metric, where the entry is associated with a specified logical state and with the specified charge loss classification value. For example, as the scans are conducted, for every skewed distribution of EC values observed by the scan manager 113, the scan manager 113 can increment the skew counter for each positively skewed distribution of EC values and decrement the counter for each negatively skewed distribution of EC values. The values of the counter can be recorded for each programming level and corresponding CBC index number in the calibration table or in another table associated with the calibration table.

In some implementation, responsive to determining that the aggregate value of the second data state metric does not satisfy a second criterion, the scan manager 113 can increment, for the group of wordlines, an occurrence counter that counts occurrences of the aggregate value of one of the data state metrics failing to satisfy their respective criterion (i.e., RBER criterion, or EC criterion respectively). For example, after determining that the aggregate RBER exceeds a threshold value N and applying additional voltage pulses, responsive to determining that the aggregate EC count does not exceed a pre-determined threshold value M (i.e., fails to satisfy the criterion), the scan manager 113 can increment, for the group of wordlines, an occurrence counter that counts occurrences of the aggregate EC failing to exceed the value M (i.e., failing to satisfy the criterion). Each instance of the aggregate value of the latter data state metric failing to satisfy the criterion can be referred to as a forgiven state, since the above-threshold aggregate RBER value can be referred to as forgiven due to the below-threshold aggregate EC value.

Further, in some embodiments, the scan manager 113 can determine whether the value of the occurrence counter satisfies another criterion (e.g., an occurrence criterion). The occurrence criterion can, in some embodiments, be satisfied if the counter of occurrences of the aggregate value of one of the data state metrics failing to satisfy their respective criterion (i.e., RBER criterion, or EC criterion respectively) exceeds a pre-determined threshold value. In the same or other embodiments, occurrence criterion can be satisfied if the counter of occurrences of the aggregate value of one of the data state metrics failing to satisfy their respective criterion (i.e., RBER criterion, or EC criterion respectively) is equal to or is less than a pre-determined threshold value K. Thus, in some embodiments, responsive to determining that the value of the occurrence counter satisfies the occurrence criterion, the scan manager 113 can, identify (e.g., in the calibration table) a read reference voltage offset (e.g., recorded in an entry) associated with the specified charge state to which the memory cells in the set are charged (i.e., or corresponding logical state to which the memory cells in the set are programmed). For example, in embodiments where the value of the occurrence counter satisfies the third criterion when the value of the occurrence counter is equal to or greater than the pre-determined threshold value K, the scan manager 113 can determine that the value of the occurrence counter (i.e., forgiven state counter) satisfies the criterion.

Consequently, responsive to determining that the value of the occurrence counter is equal to or greater than the pre-determined threshold value K, the scan manager 113 can update the read reference voltage offset (e.g., update the reference voltage offset entry in the calibration table 320) based on the value of the skew counter. For example, for each positive skew count indicated by the skew counter, the scan manager 113 can modify the corresponding entry in the calibration table by 10 mV. Similarly, for each negative skew count indicated by the skew counter, the scan manager 113 can modify the corresponding entry in the calibration table by −10 mV. Accordingly, if the skew counter for the set of memory cells programmed to programming level L14 is 2, then the scan manager 113 can add 20 to the voltage offset value previously recorded in the corresponding entry of the calibration table. In the several embodiments, the scan manager 113 can subsequently apply the updated read reference voltage offset(s) in a read operation performed on the memory cells connected to the group of wordlines. Embodiments implementing the various aspects and principles of the operation of the scan manager 113 mentioned above are described in more detail below with reference to FIGS. 2B-2D, and FIG. 3. Further details with regards to these generally described operations of the scan manager 113 are explained below with reference to FIGS. 4-5.

Figure 2B:
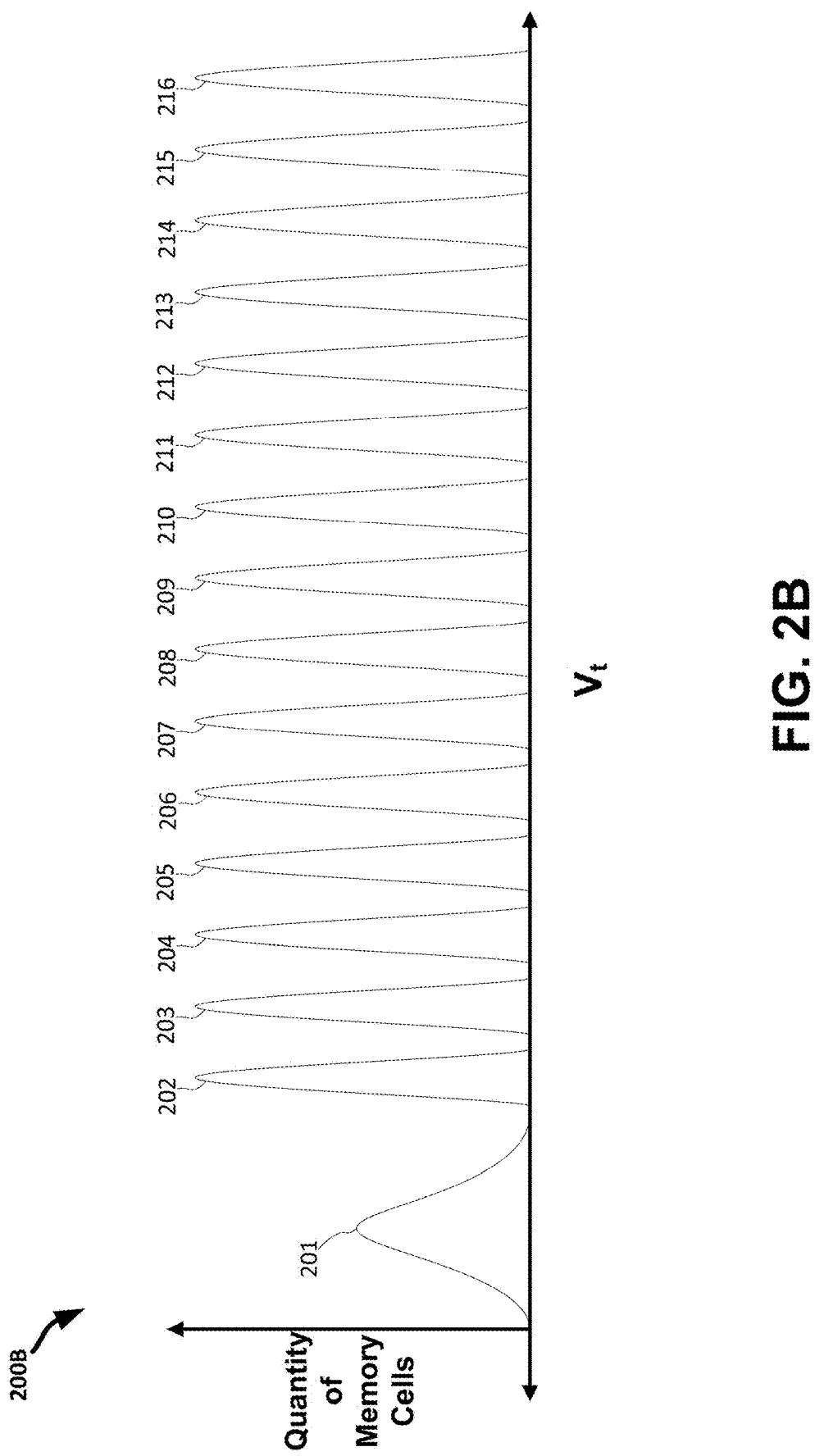
FIG. 2B is a graph of an example set of threshold voltage distributions of multiple memory cells of a memory array in a memory device in accordance with some embodiments of the present disclosure.

FIG. 2B is a graph 200B of an example set of threshold voltage distributions of multiple memory cells of a memory array in a memory device in accordance with some embodiments of the present disclosure. In some embodiments, memory cells on a block of a memory device (e.g., memory device 130 of FIG. 1) can have different $V_t$ values an aggregate representation of which for a set of these memory cells can be shown with plots on a graph such as graph 200B. For example, a set of $V_t$ ranges and their distributions for a group of sixteen-level memory cells, e.g., QLC memory cells is depicted in FIG. 2B. In some embodiments, each of these memory cells can be programmed to a $V_t$ that is within one of sixteen different threshold voltage ranges 201-216. Each of the different $V_t$ ranges can be used to represent a distinct programming state that corresponds to a particular pattern of four bits. In some embodiments, the threshold voltage range 201 can have a greater width than the remaining threshold voltage ranges 202-216. This can be caused by the memory cells initially all being placed in the programming state corresponding to the threshold voltage range 201, after which some subsets of those memory cells can be subsequently programmed to have threshold voltages in one of the threshold voltages ranges 202-216. Because write (i.e., programming) operations can be more precisely controlled than erase operations, these threshold voltage ranges 202-216 can have more narrow distributions.

In some embodiments, the threshold voltage ranges 201, 202, 203, 204, 205, 206, 207, 208, 209, 210, 211, 212, 213, 214, 215, and 216 can each represent a respective programming state (e.g., represent L0, L1, L2, L3, L4, L5, L6, L7, L8, L9, L10, L11, L12, L13, L14 and L15 respectively). For example, if the $V_t$ of a memory cell is within the first of the sixteen threshold voltage ranges 201, the memory cell in this case can be said to be in a programming state L0 corresponding to the memory cell storing a 4-bit logical value of '1111' (this can be referred to as the erased state of the memory cell). Thus, if the threshold voltage is within the second of the sixteen threshold voltage ranges 202, the memory cell in this case can be said to be in a programming state L1 corresponding to the memory cell storing a 4-bit logical value '0111'. If the threshold voltage is within the third of the sixteen threshold voltage ranges 203, the memory cell in this case can be storing a programming state L2 having a 4-bit logical value '0011,' and so on. In some embodiments, a correspondence table such as Table 1 can provide a correspondence between the states of the memory cells and their corresponding logical values. Other associations of programming states to corresponding logical data values are envisioned. For the purposes of this disclosure, memory cells that are in the lowest state (e.g., the erased state or L0 data state) can be referred to as unprogrammed, erased, or set to the lowest programming state.

TABLE 1

| Programming State | Logical Programming Value | Programming State | Logical Data Value |
|---|---|---|---|
| L0 | 1111 | L8 | 1100 |
| L1 | 0111 | L9 | 0100 |
| L2 | 0011 | L10 | 0000 |
| L3 | 1011 | L11 | 1000 |
| L4 | 1001 | L12 | 1010 |
| L5 | 0001 | L13 | 0010 |
| L6 | 0101 | L14 | 0110 |
| L7 | 1101 | L15 | 1110 |

Notably, the distributions 201-216 can be separated by valleys of varying widths. Furthermore, with time and continued use, the depicted distributions and valleys can shift and change in width. The data state metric of voltage shift obtained from various scans performed by the embodiments described herein can be obtained for various valleys, such as the fifteenth valley between adjacent distributions (i.e., valley between distributions 215-216) or the first valley between adjacent distributions (i.e., valley between distributions 201-202). Accordingly, the scans described herein involve distinguishing one state of a memory cell from another and determining data state metrics associated with the depicted distributions and valleys. This relationship is further clarified by focusing on memory cell states represented by two adjacent $V_t$ distributions, as explained in more detail with reference to FIG. 2C.

Figure 2C:
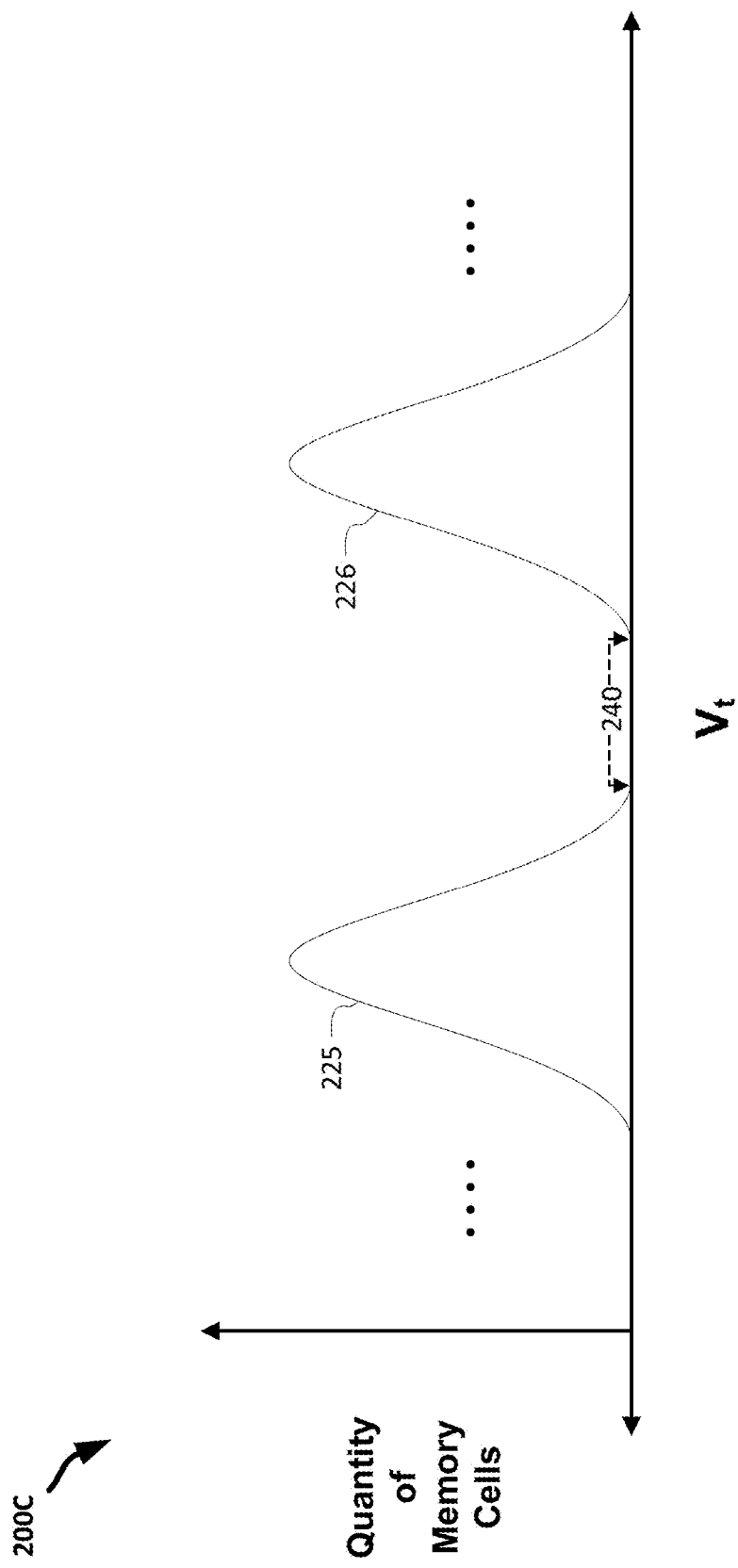
FIG. 2C is a graph of two example threshold voltage distributions of multiple memory cells of a memory array in a memory device in accordance with some embodiments of the present disclosure.

FIG. 2C is a graph 200C of two example threshold voltage distributions of multiple memory cells of a memory array in a memory device in accordance with some embodiments of the present disclosure. Consider the depiction FIG. 2C of an example $V_t$ distribution 225-226 to be analogous to a pair of adjacent $V_t$ distributions from graph 200B of FIG. 2B. For example, the $V_t$ distributions 225-226 of FIG. 2C can represent some portion of the distributions for threshold voltage ranges 201-216 of FIG. 2B after the completion of a write (i.e., programming) operation for a group of memory cells. As seen in FIG. 2C, adjacent threshold voltage distributions 225-226 can be separated by a valley with margins 240 (e.g., empty voltage level space) at the end of a programming operation. Applying a read voltage (i.e., sensing voltage) between the margins 240 to the control gates of the group of memory cells can be used to distinguish between the memory cells of the threshold voltage distribution 225 (and any lower threshold voltage distribution) and the memory cells of the threshold voltage distribution 226 (and any higher threshold voltage distribution).

Due to a phenomenon called charge loss, which can include quick charge loss (QCL) and slow charge loss (SCL), the threshold voltage of a memory cell can change over time as the electric charge contained in the cell degrades. As previously discussed, this change results in a shift of the $V_t$ distributions over time and can be referred to as a temporal $V_t$ shift (since the degrading electric charge causes the voltage distributions to shift along the voltage axis towards lower voltage levels and causes the valley defined by margins 240 to narrow over time). Further, during the operation of a memory device, the QCL can be caused by the threshold voltage changing rapidly at first (immediately after the memory cell was programmed), after which the effect of SCL becomes more evident as the $V_t$ shift slows down in an approximately logarithmic linear fashion with respect to the time elapsed since the cell was programmed. In various embodiments, this temporal $V_t$ shift, if left unadjusted, can narrow the valley width between distributions 225 and 226 (i.e., can reduce the read window between the margins 240 at the edges of the threshold voltage distributions 225-226) over time, and can cause these threshold voltage distributions 225 and 226 to overlap, making it more difficult to distinguish between cells whose actual $V_t$ is within the range of one of the two adjacent $V_t$ distributions 225-226. Accordingly, failure to mitigate the temporal $V_t$ shift (e.g., caused by the SCL) can result in the increased trigger rate and bit error rate in read operations. Further, failing to address or account for the $V_t$ shift across all $V_t$ distributions caused by the back-pattern effect discussed previously can cause increases in read errors, resulting in a high read trigger rate, which in turn negatively impacts overall latency, throughput, and QoS of a memory device. The numbers of distributions, programming levels, and logical values in the illustrative examples of FIGS. 2B-2C are chosen for illustrative purposes and are not to be interpreted as limiting, other embodiments can use various other numbers of distributions, associated programming levels, and corresponding logical values can be used in the various embodiments disclosed herein.

Figure 2D:
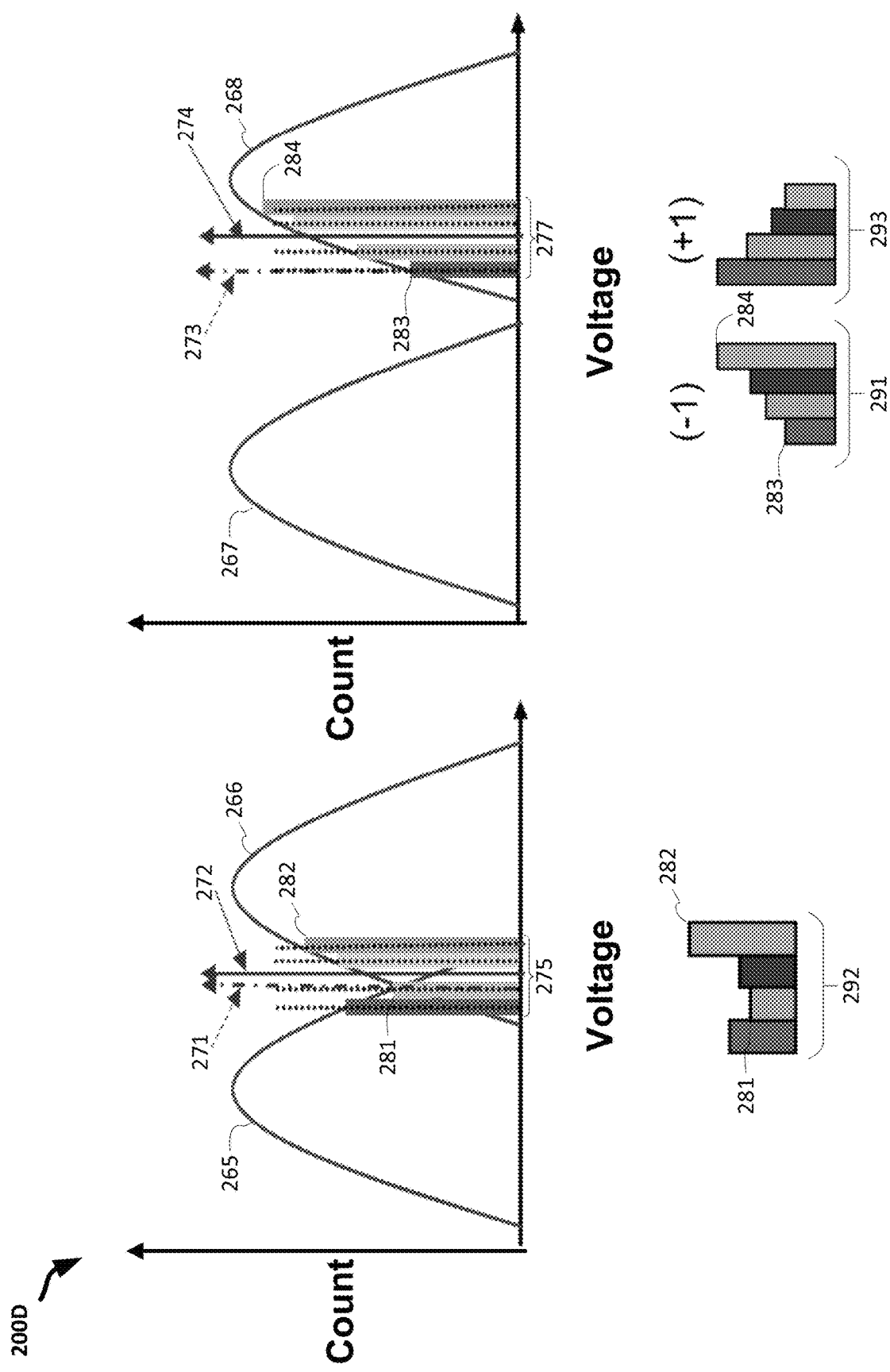
FIG. 2D depicts a comparison of two graphs of an error count as a function of an applied read voltage, in accordance with some embodiments of the present disclosure.

FIG. 2D depicts a graph 200D of an error count as a function of an applied read voltage, in accordance with some embodiments of the present disclosure. The error count can be expressed in terms of an absolute total count (EC) or a count of errors that occurs within a specified time period (i.e., an error rate) such as an RBER. The voltage can be expressed in mV. With respect to this FIG. 2D, references to an error count (EC) in the described embodiment can be replaced with references to a raw bit error rate (RBER) in other embodiments without departing from the spirit and scope of this disclosure.

As noted above, in some embodiments, while performing one or more scans of memory cells connected to a group of wordlines, one or more read reference voltage pulses can be applied and the resulting data state metric values (e.g., EC, RBER) can be measured and recorded. Accordingly, for reading cells programmed to specified programming states, sequences of voltage pulses can be applied to calibrate the read reference voltage (i.e., to determine the appropriate voltage level that minimizes the EC and/or RBER). To do that, the voltage pulses in each sequence can be offset from an initial voltage by a predetermined amount and applied to the same set of cells to determine whether or not the resulting data state metric (e.g., EC, RBER) value is lower than that which resulted from an earlier pulse. In this manner, for each applied voltage pulse a corresponding measure of each of the one or more data state metrics can be obtained. Accordingly, for each sequence of applied voltages, a distribution of the resulting values of the data state metric can be generated and recorded. Thus, the graphs and plots depicted in FIG. 2D illustrate example scenarios resulting from the application of voltage pulses to a set of memory cells connected to a group of wordlines that are being scanned.

Accordingly, one scenario is represented by adjacent voltage distributions 265 and 266 each of which respectively represent different logical programming states of a memory cell. In some embodiments, to perform a read calibration (e.g., a coarse read calibration) a read operation can be performed on one or more memory cells, by (i.e., determine the programming state that the cell is in) initially applying a read reference voltage 272 that is offset by a corresponding amount (e.g., as indicated by an entry identified by the corresponding programming level and CBC index for the memory cell) recorded in a calibration table. If the data state metric obtained after that application satisfies a criterion (e.g. if an EC/RBER exceeds a threshold value), one or more additional voltage pulses 275 that are each offset from that initial voltage pulse by respective predetermined amounts can be applied. After each application a corresponding measure of a data state metric can be obtained. Consequently, in some embodiments, the offset at which the voltage pulse generated the lowest measure of the data state metric can be selected as the calibrated voltage value that should be applied to read a memory cell programmed to the programming level to which the scanned cells were programmed. Accordingly, the graphs 281 and 282 approximately represent respective error counts resulting from the application of specified corresponding read reference voltage levels, each at a different predetermined offset from an initially applied voltage level 272 for a group of memory cells. While the plot 282 does not represent a threshold voltage distribution or valley, the points along plot 282 can be correlated with points along a distribution curve (e.g., distributions 201-208 of FIG. 2B or distributions 225-226 of FIG. 2C). Accordingly, the plot 282 can be related to data state metrics related to a valley between two adjacent distributions, each distributions representing a different programming state of a cell. Further, the graph 281 represents the EC resulting from the application of a voltage pulse 271 that is offset from an initial voltage pulse 272. Accordingly, the resulting EC distribution 292 can be a normal distribution with a clear minimum EC resulting from voltage pulse 271.

The other scenario can be represented by adjacent voltage distributions 267 and 268 each of which respectively represent different logical programming states of a memory cell. In some embodiments, to perform a read calibration (e.g., a coarse read calibration) a read operation can be performed on one or more memory cells, by (i.e., determine the programming state that the cell is in) initially applying a read reference voltage 274 that is offset by a corresponding amount (e.g., as indicated by an entry identified by the corresponding programming level and CBC index for the memory cell) recorded in a calibration table. If the data state metric obtained after that application satisfies a criterion (e.g. if an EC/RBER exceeds a threshold value), one or more additional voltage pulses 277 that are each offset from that initial voltage pulse by respective predetermined amounts can be applied. After each application a corresponding measure of a data state metric can be obtained. Consequently, in some embodiments, the offset at which the voltage pulse generated the lowest measure of the data state metric can be selected as the calibrated voltage value that should be applied to read a memory cell programmed to the programming level to which the scanned cells were programmed. Accordingly, the graphs 284 and 283 approximately represent respective error counts resulting from the application of specified corresponding read reference voltage levels, each at a different predetermined offset from an initially applied voltage level 274 for a group of memory cells. While the plot 284 does not represent a threshold voltage distribution or valley, the points along plot 284 can be correlated with points along a distribution curve (e.g., distributions 201-208 of FIG. 2B or distributions 225-226 of FIG. 2C). Accordingly, the plot 284 can be related to data state metrics related to a valley between two adjacent distributions, each distributions representing a different programming state of a cell. Further, the graph 283 represents the EC resulting from the application of a voltage pulse 273 that is offset from an initial voltage pulse 274. In this scenario, the resulting EC distribution 291 can be a negatively skewed distribution with an ambiguous minimum EC occurring as a result of voltage pulse 273. Similarly, a positively skewed distribution 293 can also result from the application of a sequence of voltages (e.g., a sequence of voltages applied at lower voltage levels).

In some embodiments, plot 282 can be generated using metric values obtained during a valley health check scan. For example, a graph representative the lowest error count can correspond to a read voltage that best distinguishes between two adjacent threshold voltage distributions. In some embodiments, this lowest error count can be referred to as a center error count ($EC_0$) since it should occur at the center of the valley between two distributions. The $EC_0$ can be estimated by applying a series of voltages and checking the corresponding error count until the voltage corresponding to lowest error count is identified. Alternatively, the $EC_0$ can be estimated by taking half the sum of the error counts at one valley margin ($EC_1$) and the error counts at another valley margin ($EC_2$). In some embodiments, the valley width can be inversely related to (i.e., be an inverse fraction of) the logarithm of $EC_0$, which can be represented by $$\log_{10}\left(\frac{((EC_1) + (EC_2))}{2}\right).$$

In the various embodiments described, the shift in threshold voltage (i.e., the valley shift value) can be determined by comparing the $EC_0$ measured at a particular time and the $EC_0$ measured at subsequent time. As previously noted, the aspects described with reference to FIGS. 1 and 3 are further described in additional detail with reference to FIGS. 4-5.

Figure 4:
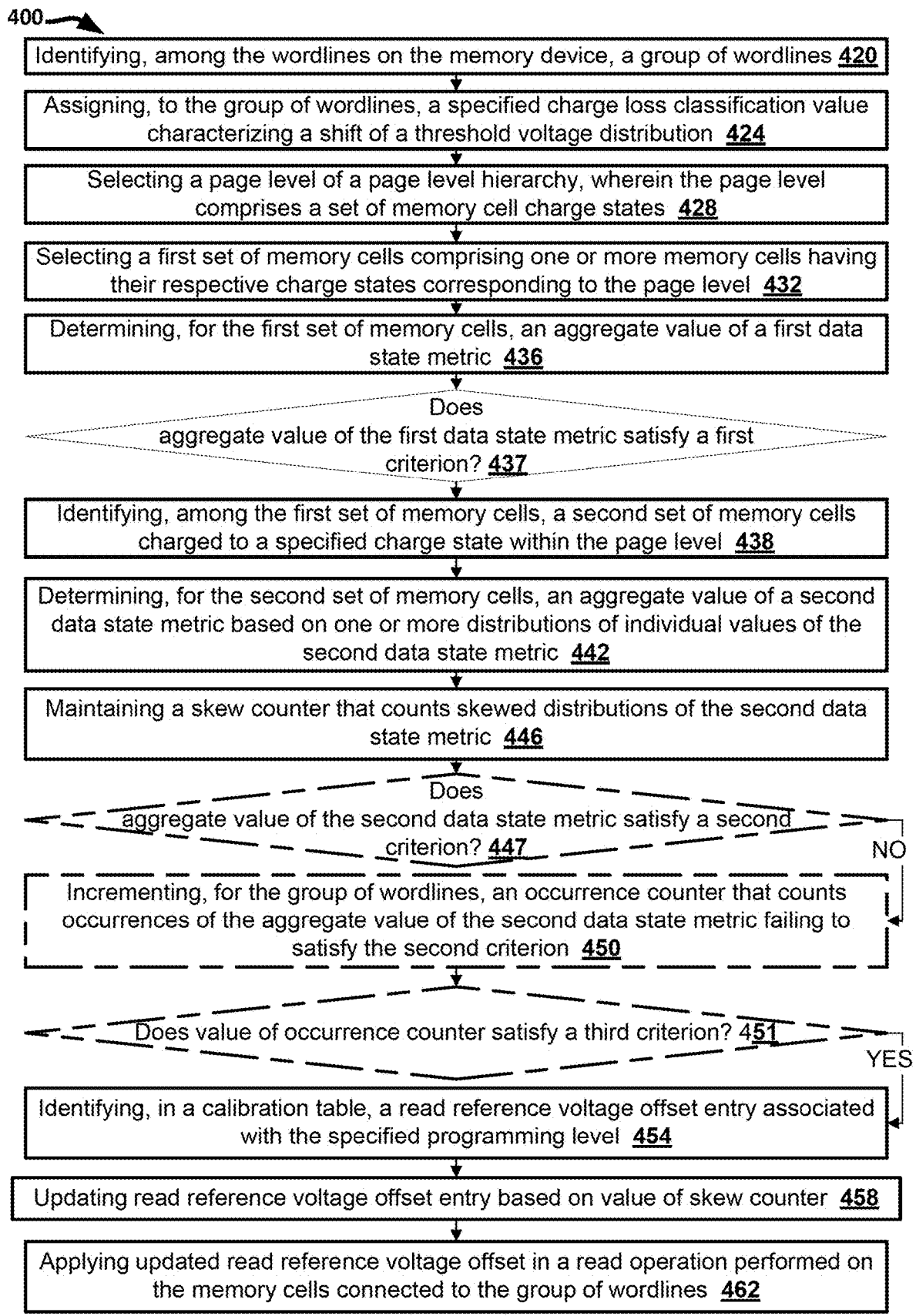
FIG. 4 is a flow diagram of an example method for performing dynamic calibration of read voltage in memory devices in accordance with some embodiments of the present disclosure.

FIG. 4 is flow diagram of an example method 400 for performing dynamic calibration of read voltage in memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. In some embodiments of the present disclosure, one type of data storage unit (e.g., a cell) can reside on another type of data storage unit (e.g., a group of wordlines) of a memory device (e.g., the memory device 130 of FIG. 1), such that, relative to the latter data storage unit, the former is a lower order data storage unit, and, relative to the former data storage unit, the latter is a higher order data storage unit. Accordingly, although, in some embodiments, the method 400 is described by reference to cells, wordlines, and pages of a memory device, the method 400 can similarly be described by reference to other data storage units, where other lower order data storage units (i.e., $Unit_{Type2}$) can be substituted for cells and other higher order data storage units (i.e., $Unit_{Type1}$) can be substituted for wordlines. For the sake of brevity and legibility, the present disclosure does not explicitly recite each and every variation and permutation of the described $Unit_{Type1}$:$Unit_{Type2}$ pairs. However, the present disclosure is to be interpreted as explicitly disclosing all such variations and permutations. For example, the method 400 described in terms of a page:die data storage unit pair can be embodied by other $Unit_{Type1}$:$Unit_{Type2}$ pairs such as die:plane, die:block, die:cell array, die:cell, plane:block, plane:page, plane:cell array, plane:cell, block:page, block:cell array, block:cell, page:half-page, page:cell array, page:cell, block:wordline, plane:block-and-page-combination, die:page-and-cell-array-combination, etc. Additionally, one or more processes can be omitted in various embodiments. Thus, not all processes are required in every embodiment. Other process flows are possible.

In some embodiments of the present disclosure, at operation 420 the processing logic can identify, among the wordlines on a memory device (e.g., the memory device 130 of FIG. 1), a group of wordlines. At operation 424 the processing logic can assign to the group of wordlines, a specified charge loss classification value corresponding to a shift of a threshold voltage distribution. For example, at operation 424, the processing logic can assign a CBC index value to the group of wordlines that corresponds to a shift of a threshold voltage distribution resulting from SCL on the memory cells connected to the wordlines in that group.

At operation 428, the processing logic can select a page level within a page level hierarchy, where the selected page level includes a particular set of memory cell charge states. Since each page level within the hierarchy can correspond to a particular logical page, the processing logic can select a logical page among the logical pages for the group of wordlines where each logical page includes multiple charge states to which the cells on the wordlines can be charged. The processing logic can at operation 432 select a set of memory cells the charge state of which is within the page level (i.e., a set of memory cells all charged to a charge state within the set of charge states of the selected page level). In some embodiments, the processing logic can scan the group of wordlines. In some embodiments, the processing logic can scan, all the wordlines in the group while in other embodiments the processing logic can scan only the wordlines to which memory cells that are charged to one of the charge states (i.e., programmed to one of the logical states) within the selected page level (i.e., logical page).

Further, at operation 436, the processing logic can determine, for the set of memory cells whose charge state is within the page level (i.e., whose programmed logical state is within the logical page), an aggregate value of a data state metric (e.g., EC, RBER). The processing logic can then, determine, at operation 437 whether the aggregate value of the first data state metric satisfies a criterion. For example, in some cases the criterion can be satisfied if the value is equal to or exceeds a pre-determined threshold value (e.g., when an RBER is greater than N bit-errors/ms). In other cases, the criterion can be satisfied if the value is equal to or is less than a pre-determined threshold value (e.g., when an EC is less than M errors). Therefore, the processing logic can, determine, at operation 437 whether the aggregate RBER satisfies an RBER criterion (e.g., exceeds a threshold RBER value). In some embodiments, the processing logic can, at operation 438 identify, within the set of memory cells, another (e.g., smaller) set (e.g., subset) of memory cells charged to a specified charge state within the page level (i.e., memory cells that are programmed to a specified programming level within the logical page) that was selected. For example, is the set of memory cells at operation of 436 were programmed to a level within the top page (TP), then, at operation 438 the processing logic can identify a set of cells within that set that are programmed to logical state 15 (L15) if logical state fifteen is defined to form part of the TP (e.g., in an embodiment where the logical pages are defined as follows: TP—L5/L10/L12/L15; XP—L2/L8/L14; UP—L3/L7/L9/L13; LP—L1/L4/L6/L11).

In the same or other embodiments, the processing logic can, at operation 442 determine, for the smaller set (i.e. subset) of memory cells, an aggregate value of another data state metric based on one or more distributions of individual values of this other data state metric (e.g., if at operation 436 RBER was determined, then at operation 442 EC can be determined). As the processing logic performs the scan(s) and determines corresponding data state metrics (e.g., RBER, EC), the programming logic can record the values and distributions of the values of these data state metrics resulting from the application of sequences of one or more voltage pulses. Accordingly, at operation 446, the processing logic can maintain a skew counter that counts skewed distributions (e.g., positively skewed distributions or negatively skewed distributions) of each of the one or more data state metrics. For example, at operation 446, the processing logic can maintain a skew counter that counts skewed distributions of EC or skewed distributions of RBER measured as a result of the application of one or more voltage pulses applied to the memory cells connected to the group of wordlines.

Further, the processing logic can determine, at operation 447, whether the aggregate value of the latter data state metric satisfies a criterion. In some implementations this can be a different criterion that the one used for the previous data state metric. For example, if the RBER was determined at operation 436, then at operation 447, the processing logic can determine whether the aggregate EC satisfies an EC criterion (e.g., exceeds a threshold EC value). As the processing logic determines the respective values of each of the one or more data state metric values, the processing logic can at operation 450, increment, for the group of wordlines, an occurrence counter that counts occurrences of the aggregate value of the latter data state metric failing to satisfy its corresponding criterion. For example, at operation 450, the processing logic can increment, for the group of wordlines, an occurrence counter that counts occurrences of the EC failing to exceed a pre-determined threshold value.

In some implementations, the processing logic can, at operation 551 determine whether the value of the occurrence counter satisfies an occurrence criterion. The occurrence criterion can, in some embodiments, be satisfied if the counter of occurrences of the aggregate value of one of the data state metrics failing to satisfy their respective criterion (i.e., RBER criterion, or EC criterion respectively) exceeds a pre-determined threshold value. In the same or other embodiments, occurrence criterion can be satisfied if the counter of occurrences of the aggregate value of one of the data state metrics failing to satisfy their respective criterion (i.e., RBER criterion, or EC criterion respectively) is equal to or is less than a pre-determined threshold value K. In the same or other embodiments, responsive to determining at operation 451 that the value of the occurrence counter satisfies the occurrence criterion, at operation 454, the processing logic can identify, in the calibration table, a read reference voltage offset entry associated with the charge state to which the memory cells in the set are charged (i.e., or corresponding logical state to which the memory cells in the set are programmed). The processing logic can then, at operation 458 update the read reference voltage offset entry based on value of skew counter. Subsequently, at operation 462, the processing logic can apply the updated read reference voltage offset in a read operation performed on the memory cells connected to the group of wordlines. Further details regarding additional or alternative operations involved in performing dynamic calibration of read voltage are explained below with reference to FIG. 5.

Figure 5:
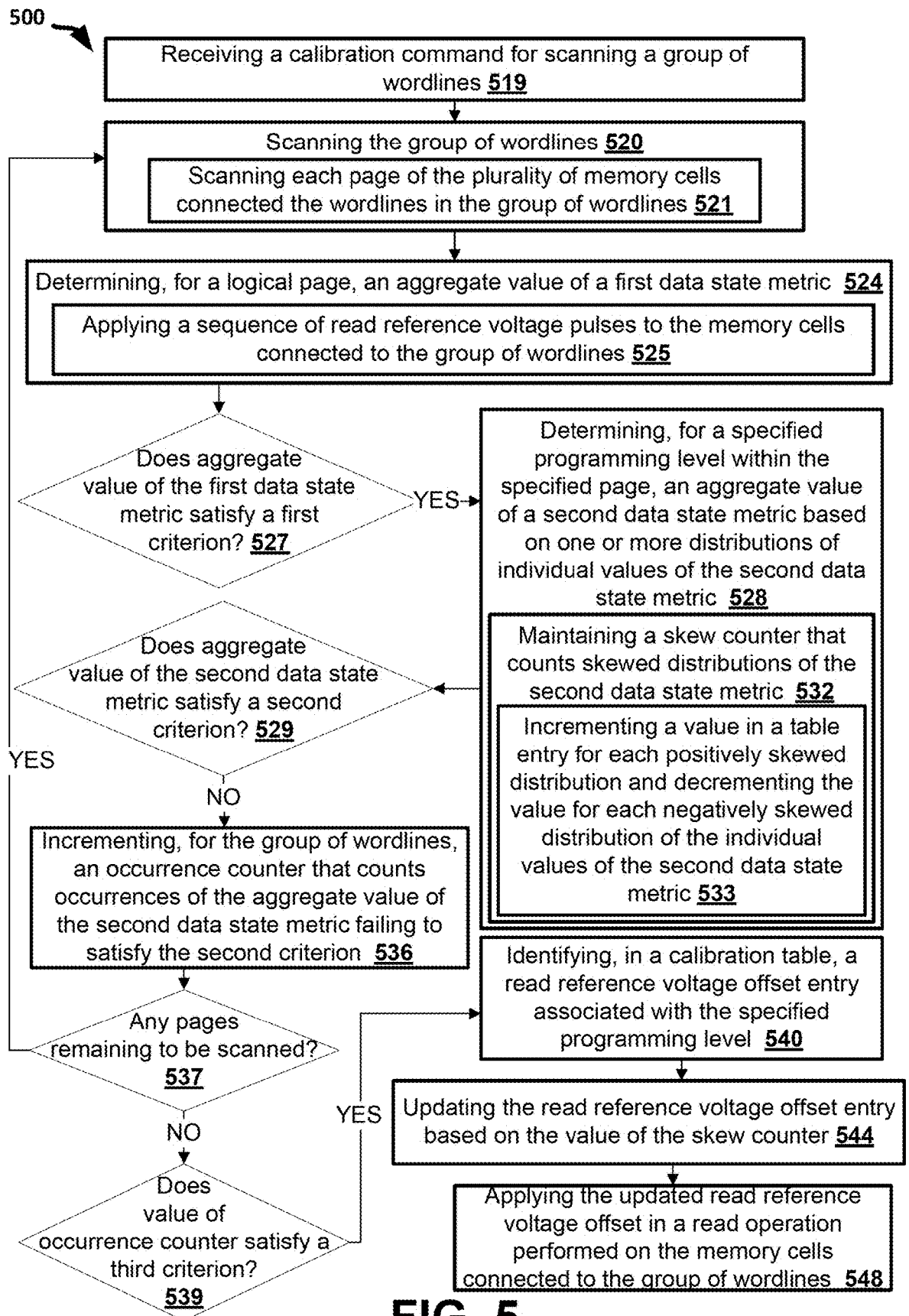
FIG. 5 is a flow diagram of an example method for performing dynamic calibration of read voltage in memory devices in accordance with some embodiments of the present disclosure.

FIG. 5 is flow diagram of an example method 500 for example method for performing dynamic calibration of read voltage in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. In some embodiments of the present disclosure, one type of data storage unit (e.g., a page) can reside on another type of data storage unit (e.g., a die) of a memory device (e.g., the memory device 130 of FIG. 1), such that, relative to the latter data storage unit, the former is a lower order data storage unit, and, relative to the former data storage unit, the latter is a higher order data storage unit. Accordingly, although, in some embodiments, the method 500 is described by reference to planes and dies of a memory device, the method 500 can similarly be described by reference to other data storage units, where other lower order data storage units (i.e., $\text{Unit}_{Type2}$) can be substituted for planes and other higher order data storage units (i.e., $\text{Unit}_{Type1}$) can be substituted for dies wherever they appear in the description. For the sake of brevity and legibility, the present disclosure does not explicitly recite each and every variation and permutation of the described $\text{Unit}_{Type1}$: $\text{Unit}_{Type2}$ pairs. However, the present disclosure is to be interpreted as explicitly disclosing all such variations and permutations. For example, the method 500 described in terms of a page:die data storage unit pair can be embodied by other $\text{Unit}_{Type1}$:$\text{Unit}_{Type2}$ pairs such as die:plane, die: block, die:cell array, die:cell, plane:block, plane:page, plane: cell array, plane:cell, block:page, block:cell array, block: cell, page:half-page, page:cell array, page:cell, block: wordline, plane:block-and-page-combination, die:page-and-cell-array-combination, etc. Additionally, one or more processes can be omitted in various embodiments. Thus, not all processes are required in every embodiment. Other process flows are possible.

In several embodiments described herein, operations of example method 500 can be performed together with or instead of operations of example method 400. In some embodiments of the present disclosure, at operation 519, the processing logic can receive a calibration command for scanning a group of wordlines of a memory device (e.g., the memory device 130 of FIG. 1).

In some embodiments, at operation 520, the processing logic can scan the group of wordlines. In some cases the processing logic can scan the group of wordlines by scanning, at operation 521, each page of memory cells connected the wordlines in the group of wordlines (i.e., each logical page that contains a programming level to which a memory cell connected to a wordline in the group is programmed). In some implementations, the processing logic can, at operation 524, determine, for a logical page, an aggregate value of a data state metric (e.g., RBER, EC) by applying, at operation 525 a sequence of read reference voltage pulses to the memory cells connected to the group of wordlines.

In the same or other embodiments, the processing logic can, at operation 527 determine whether the aggregate value of that data state metric satisfies a criterion (e.g., determine whether an aggregate RBER satisfies an RBER criterion). For example, it can determine whether the aggregate RBER exceeds a threshold RBER value. At operation 528 the processing logic can determine, for a specified charge state (i.e. programming state) within the specified page, an aggregate value of a another state metric (e.g., EC) based on one or more distributions of individual values of this other data state metric. Meanwhile, at operation 532 that occurs in parallel with operations 524 and/or 528, the processing logic can, maintain a skew counter that counts skewed distributions of the latter data state metric. The processing logic can maintain the skew counter, by incrementing, at operation 533 a value in a table entry for each positively skewed distribution and decrementing the value for each negatively skewed distribution of the individual values of the latter data state metric.

Further, in some embodiments, at operation 529, the processing logic can determine whether the aggregate value of the latter data state metric satisfies a criterion. For example, the processing logic can determine, at operation 529, whether the aggregate EC satisfies the EC criterion (e.g., exceeds a threshold EC value). In some cases, the aggregate value will fail to satisfy the criterion. Accordingly, the processing logic can, at operation 536 increment, for the group of wordlines, an occurrence counter that counts occurrences of the aggregate value of the second data state metric failing to satisfy the second criterion.

In the same or other embodiments, at operation 537, the processing logic can determine whether any pages remain to be scanned. For example, for a group of wordlines connected to QLC cells, the processing logic, at operation 537 can determine whether any of the four pages (i.e., TP, XP, UP, LP) remain to be scanned. Responsive to determining, at operation 537, that no pages remain to be scanned, the processing logic can, at operation 539 determining whether value of the occurrence counter satisfies an occurrence criterion (e.g., whether the value of the occurrence counter exceeds a threshold predetermined value).

In response to determining that the value of the occurrence counter satisfies the occurrence criterion, the processing logic can, at operation 540 identify, in the calibration table, the read reference voltage offset entry associated with the specified charge state to which the memory cells in the set are charged (i.e., or corresponding logical state to which the memory cells in the set are programmed) and the relevant CBC index value for the memory cells being scanned. Then, the processing logic can, at operation 544 update the read reference voltage offset entry based on the value of the skew counter. For example, for each positive skew count indicated by the skew counter, the processing logic can modify the corresponding entry in the calibration table by 10 mV. Similarly, for each negative skew count indicated by the skew counter, the processing logic can modify the corresponding entry in the calibration table by −10 mV. Accordingly, if the skew counter for the set of memory cells programmed to programming level L3 is 3, then the processing logic can add 20 to the voltage offset value previously recorded in the corresponding entry of the calibration table. Analogously, if the skew counter for the set of memory cells programmed to programming level L3 is −1, then the processing logic can subtract 10 to the voltage offset value previously recorded in the corresponding entry of the calibration table. The processing logic can then perform read operations on the memory device. Consequently, at operation 548, the processing logic can apply the updated read reference voltage offset in a read operation performed on the memory cells connected to the group of wordlines.

Figure 6:
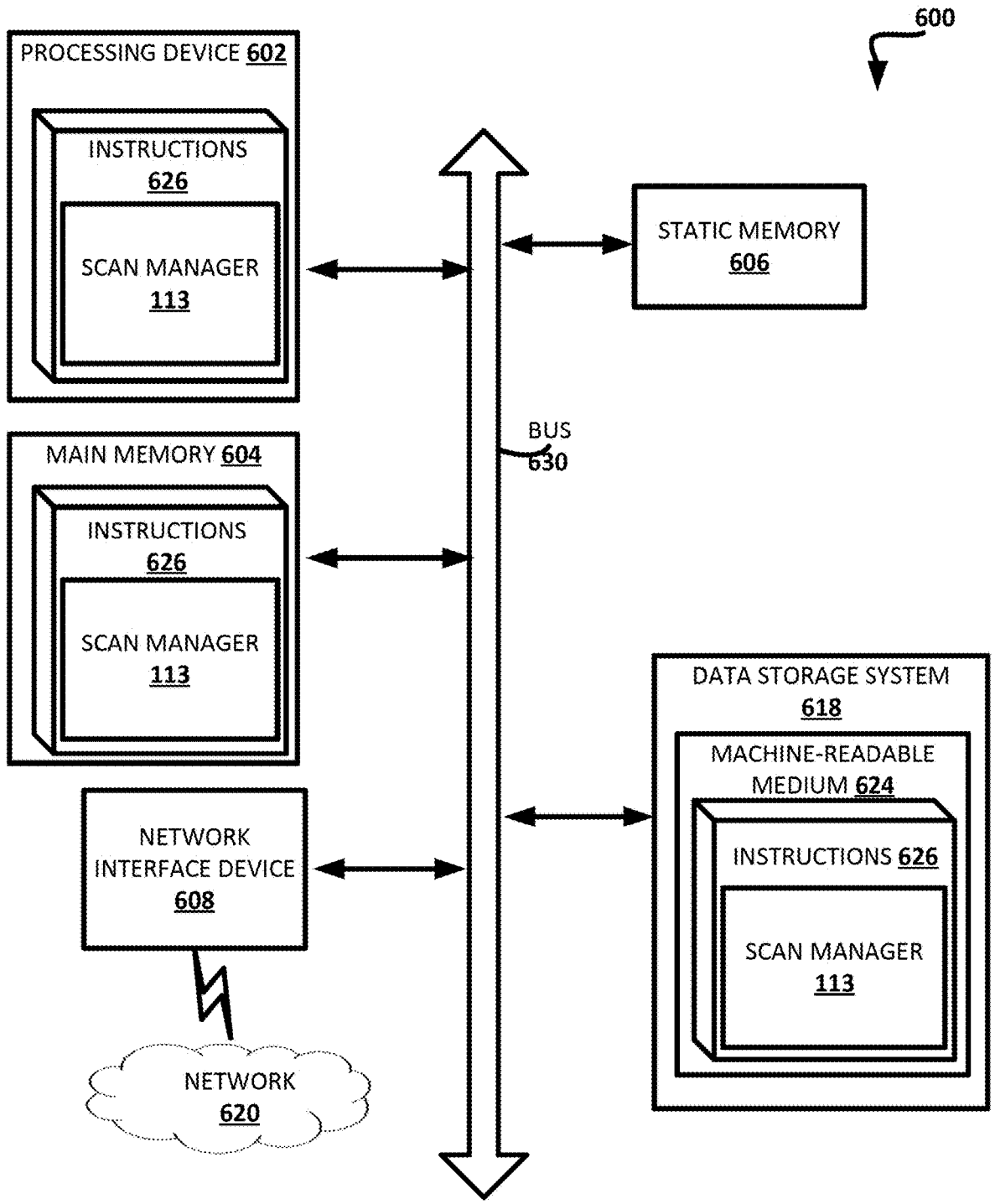
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the scan manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a scan manager (e.g., the scan manager 113 of FIG. 1 and the methods 300, 400, and 500 of FIGS. 3, 4, and 5 respectively). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory cells; and
a processing device, operatively coupled with the memory device, to perform operations comprising:
identifying, among a plurality of wordlines on the memory device, a group of wordlines, wherein each wordline of the group of wordlines is connected to a respective subset of memory cells;
assigning, to the group of wordlines, a specified charge loss classification value characterizing a shift of a threshold voltage distribution;
selecting a page level of a page level hierarchy, wherein the page level comprises a set of memory cell charge states;
selecting a first set of memory cells comprising one or more memory cells having their respective charge states corresponding to the page level;
determining, for the first set of memory cells, an aggregate value of a first data state metric;

responsive to determining that the aggregate value of the first data state metric satisfies a first criterion, identifying, among the first set of memory cells, a second set of memory cells charged to a specified charge state within the page level;
determining, for the second set of memory cells, an aggregate value of a second data state metric based on one or more distributions of individual values of the second data state metric;
maintaining a skew counter of skewed distributions of the second data state metric;
identifying a read reference voltage offset associated with the specified charge state;
updating the read reference voltage offset based on the value of the skew counter; and
applying the updated read reference voltage offset in a read operation performed on the memory cells connected to the group of wordlines.

2. The system of claim 1, wherein determining the aggregate value of the first data state metric comprises:
applying a first sequence of read reference voltage pulses to the memory cells connected to the group of wordlines.

3. The system of claim 2, wherein determining the aggregate value of the second data state metric comprises:
applying a second sequence of read reference voltage pulses to the memory cells connected to the group of wordlines, each of the first sequence and second sequence comprising one or more groups of read reference voltage pulses, wherein each group of read reference voltage pulses generates a corresponding distribution of individual values of the second data state metric, each individual value corresponding to a respective read reference voltage.

4. The system of claim 1, wherein maintaining the skew counter comprises incrementing a value in a table entry for each positively skewed distribution and decrementing the value for each negatively skewed distribution of the individual values of the second data state metric, wherein the entry is associated with a specified logical state and with the specified charge loss classification value.

5. The system of claim 1, wherein the first data state metric is a raw bit error rate (RBER), and wherein the first criterion is satisfied if the RBER value is equal to or greater than a first threshold value.

6. The system of claim 1, wherein the processing device is to further perform operations comprising:
responsive to determining that the aggregate value of the second data state metric does not satisfy a second criterion, incrementing, for the group of wordlines, an occurrence counter of the aggregate value of the second data state metric failing to satisfy the second criterion;
wherein identifying a read reference voltage offset associated with the specified charge state comprises:
responsive to determining that the value of the occurrence counter satisfies a third criterion, identifying, in a calibration table, the read reference voltage offset entry associated with the specified charge state; and
wherein updating the read reference voltage offset comprises updating the read reference voltage offset entry based on the value of the skew counter.

7. The system of claim 6, wherein the second data state metric is an error count (EC), and wherein the second criterion is satisfied when an aggregate EC value is equal to or greater than a second threshold value.

8. A method, comprising:
identifying, among a plurality of wordlines, a group of wordlines, wherein each wordline of the group of wordlines is connected to a respective subset of memory cells among a plurality of memory cells on a memory device;
assigning, to the group of wordlines, a specified charge loss classification value characterizing a shift of a threshold voltage distribution;
selecting a page level of a page level hierarchy, wherein the page level comprises a set of memory cell charge states;
selecting a first set of memory cells comprising one or more memory cells having their respective charge states corresponding to the page level;
determining, for the first set of memory cells, an aggregate value of a first data state metric;
responsive to determining that the aggregate value of the first data state metric satisfies a first criterion:
identifying, among the first set of memory cells, a second set of memory cells charged to a specified charge state within the page level;
determining, for the second set of memory cells, an aggregate value of a second data state metric based on one or more distributions of individual values of the second data state metric;
maintaining a skew counter of skewed distributions of the second data state metric;
identifying a read reference voltage offset associated with the specified charge state;
updating the read reference voltage offset based on the value of the skew counter; and
applying the updated read reference voltage offset in a read operation performed on the memory cells connected to the group of wordlines.

9. The method of claim 8, wherein determining the aggregate value of a first data state metric comprises:
applying a first sequence of read reference voltage pulses to the memory cells connected to the group of wordlines.

10. The method of claim 9, wherein determining the aggregate value of the second data state metric comprises:
applying a second sequence of read reference voltage pulses to the memory cells connected to the group of wordlines, each of the first sequence and second sequence comprising one or more groups of read reference voltage pulses, wherein each group of read reference voltage pulses generates a corresponding distribution of individual values of the second data state metric, each individual value corresponding to a respective read reference voltage.

11. The method of claim 8, wherein maintaining the skew counter comprises incrementing a value in a table entry for each positively skewed distribution and decrementing the value for each negatively skewed distribution of the individual values of the second data state metric, wherein the entry is associated with a specified logical state and with the specified charge loss classification value.

12. The method of claim 8, wherein the first data state metric is a raw bit error rate (RBER), and wherein the first criterion is satisfied if the RBER value is equal to or greater than a first threshold value.

13. The method of claim 8, further comprising:
responsive to determining that the aggregate value of the second data state metric does not satisfy a second criterion, incrementing, for the group of wordlines, an occurrence counter of the aggregate value of the second data state metric failing to satisfy the second criterion;

wherein identifying a read reference voltage offset associated with the specified charge state comprises:
  responsive to determining that the value of the occurrence counter satisfies a third criterion, identifying, in a calibration table, the read reference voltage offset entry associated with the specified charge state; and
wherein updating the read reference voltage offset comprises updating the read reference voltage offset entry based on the value of the skew counter.

14. The method of claim 13, wherein the second data state metric is an error count (EC), and wherein the second criterion is satisfied when an aggregate EC value is equal to or greater than a second threshold value.

15. A non-transitory computer-readable storage medium comprising instructions that, when executed by a processing device, cause the processing device to perform operations comprising:
  identifying, among a plurality of wordlines, a group of wordlines, wherein each wordline of the group of wordlines is connected to a respective subset of memory cells among a plurality of memory cells on a memory device;
  assigning, to the group of wordlines, a specified charge loss classification value characterizing a shift of a threshold voltage distribution;
  selecting a page level of a page level hierarchy, wherein the page level comprises a set of memory cell charge states;
  selecting a first set of memory cells comprising one or more memory cells having their respective charge states corresponding to the page level; and
  for the first set of memory cells:
    determining an aggregate raw bit error rate (RBER) value;
    responsive to determining that the aggregate RBER value satisfies a first criterion:
      identifying, among the first set of memory cells, a second set of memory cells charged to a specified charge state within the page level; and
      determining, for the second set of memory cells, an aggregate error count (EC) based on one or more distributions of individual ECs;
      maintaining a skew counter of skewed distributions of the EC; and
      responsive to determining that the aggregate EC does not satisfy a second criterion, incrementing, for the group of wordlines, an occurrence counter that of the aggregate EC failing to satisfy the second criterion;
    responsive to determining that the value of the occurrence counter satisfies a third criterion, identifying, in a calibration table, a read reference voltage offset entry associated with the specified charge state;
    updating the read reference voltage offset entry based on the value of the skew counter; and
    applying the updated read reference voltage offset in a read operation performed on the memory cells connected to the group of wordlines.

16. The non-transitory computer-readable storage medium of claim 15, wherein determining the aggregate RBER value comprises:
  applying a first sequence of read reference voltage pulses to memory cells connected to the group of wordlines.

17. The non-transitory computer-readable storage medium of claim 16, wherein determining the aggregate EC comprises:
  applying a second sequence of read reference voltage pulses to the memory cells connected to the group of wordlines, each of the first sequence and second sequence comprising one or more groups of read reference voltage pulses, wherein each group of read reference voltage pulses generates a corresponding distribution of individual ECs, each individual EC corresponding to a respective read reference voltage.

18. The non-transitory computer-readable storage medium of claim 15, wherein maintaining the skew counter comprises incrementing a value in a table entry for each positively skewed distribution and decrementing the value for each negatively skewed distribution of the individual ECs, wherein the entry is associated with a specified logical state and with the specified charge loss classification value.

19. The non-transitory computer-readable storage medium of claim 15, wherein the first criterion is satisfied if the RBER value is equal to or greater than a first threshold value.

20. The non-transitory computer-readable storage medium of claim 15, wherein the second criterion is satisfied when the aggregate EC is equal to or greater than a second threshold value.

* * * * *